United States Patent [19]
Nakatani

[11] Patent Number: 5,370,975
[45] Date of Patent: Dec. 6, 1994

[54] METHOD FOR FORMING RESIST PATTERN

[75] Inventor: Mitsunori Nakatani, Itami, Japan

[73] Assignee: Mitsubishi Denki Kabushiki Kaisha, Tokyo, Japan

[21] Appl. No.: 150,780

[22] Filed: Nov. 12, 1993

Related U.S. Application Data

[63] Continuation-in-part of Ser. No. 947,300, Sep. 18, 1992, abandoned.

[30] Foreign Application Priority Data

Jan. 31, 1992 [JP] Japan .................................. 4-046237

[51] Int. Cl.$^5$ ............................................... G03C 5/00
[52] U.S. Cl. ........................................ 430/325; 430/5; 430/311; 430/327
[58] Field of Search .................... 430/325, 5, 311, 327

[56] References Cited

U.S. PATENT DOCUMENTS 4,964,726 10/1990 Kleinknecht et al. ............... 356/357
5,153,083 10/1992 Garofalo et al. ....................... 430/5

FOREIGN PATENT DOCUMENTS 2248949 10/1990 Japan .
311345 1/1991 Japan .

OTHER PUBLICATIONS

Toh et al, "Optical Lithography With Chromeless Phase-Shifted Masks", SPIE Microlithography Proceedings, 1991, p. 35.
Todokoro et al, "Transparent Phase Shifting Masks With Multistage Phase Shifter And Comb Shape Shifter", SPIE Microlithography Proceedings, 1991.
Jinbo et al, "Improvement Of Phase-Shifter Edge Line Mask Method", Digests of Papers of 1991 Microprocess Conference, p. 62.

*Primary Examiner*—John Kight, III
*Assistant Examiner*—D. Truong
*Attorney, Agent, or Firm*—Leydig, Voit & Mayer

[57] ABSTRACT

A phase shift mask having a phase shifter with an edge angle ranging from 70° to 85° or 95° to 110° is used as a reticle in forming a resist pattern so that the exposure pattern applied to the resist has a light intensity distribution with constant light intensity contrast. A fine resist pattern having a predetermined width no more than the wavelength of the light used to form the pattern is produced precisely and reproducibly under constant developing conditions. In addition, there is provided on the side wall of the phase shifter of the phase shift mask a light shielding film which, due to its width, cannot be resolved as an exposure pattern itself. A region in which the light intensity is reduced from the constant level corresponding to the width of the light shielding film in the exposure pattern is formed by the projection lens. Therefore, a fine resist pattern having a predetermined width no more than the wavelength of the light used to form the pattern is produced precisely and reproducibly using constant developing conditions. As a result, semiconductor devices with good performance can be manufactured with high yield.

8 Claims, 6 Drawing Sheets

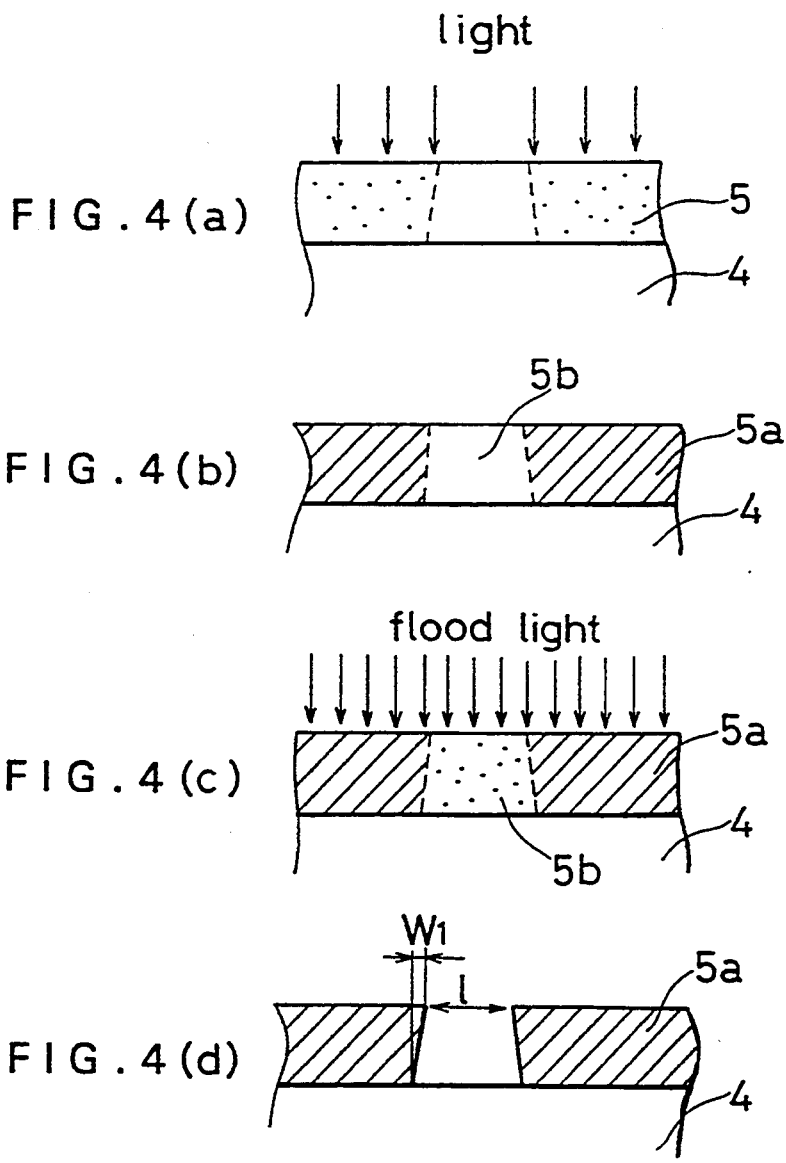

( PRIOR ART )
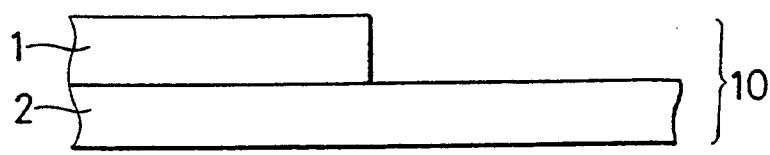
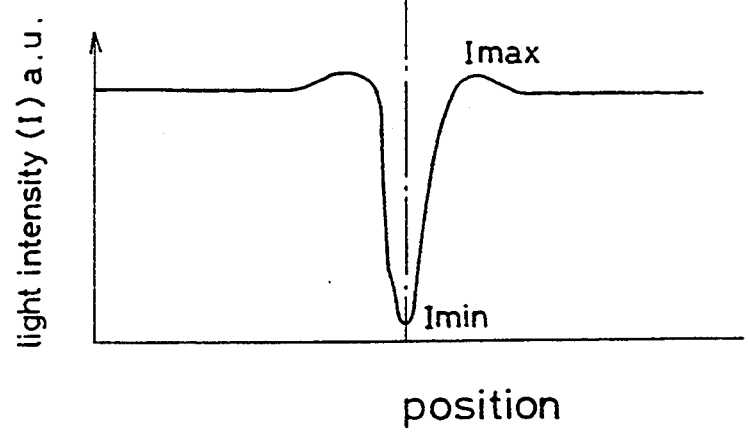
( PRIOR ART )
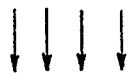
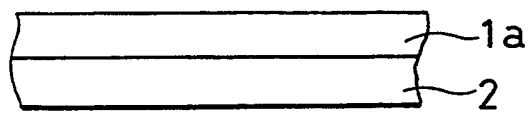
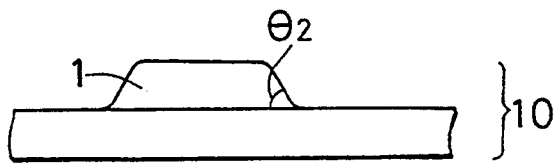

METHOD FOR FORMING RESIST PATTERN

This disclosure if a continuation-in-part of U.S. patent application Ser. No. 07/947,300, filed Sep. 18, 1992, now abandoned.

FIELD OF THE INVENTION

This disclosure is a continuation-in-part of U.S. patent application Ser. No. 07/947,300, filed Sep. 18, 1992, now abandoned.

BACKGROUND OF THE INVENTION

As semiconductor devices are highly integrated, a photlithographic technique for forming a fine resist pattern with high precision has been vigorously studied. For example, a technique capable of forming a pattern 0.3 micron or less wide on a substrate is required for a semiconductor element which operates at several tens of GHz. However, since the resist materials used as masks for etching are limited, light having a wavelength of 248 microns or longer has to be used. In this respect, the precision of a pattern is generally the same as the wavelength of light.

FIG. 9 is a view showing a reducing projection exposure apparatus which is generally used for such pattern formation. In the exposure apparatus, a wafer 15, on which a resist having a predetermined thickness is disposed, is put on a wafer stage 14 and light from an extra-high pressure mercury lamp as a light source passes through a photomask on which a predetermined mask pattern is formed, that is, a reticle 12 and then it is projected onto to the resist on the wafer 15 through a reducing projection lens 13. In addition, $\theta_1$ designates an angle formed by the optical axis of the projection lens 13 and a line formed by connecting an intersecting point of the optical axis and the wafer to the radius of the exit pupil of the projection lens.

In general, the limit of resolution (R) of the reducing projection exposure apparatus is represented by the numerical aperture ($NA = \sin\theta_1$) of the projection lens and the wavelength ($\gamma$) of light as shown in the following equation (1), where $k_1$ is a constant indicating resist performance which is 0.612 in a case of a spherical projection lens according to a theory by Rayleigh.

$$R = k_1 \gamma / NA \quad (1)$$

In addition, when the resist pattern is actually formed, the depth of focus (DOF) shown in the following equation (2) is necessary for a curve or a step difference of the substrate. The DOF is generally set to 1.5 microns or more. In the equation (2), $k_2$ is a constant.

$$DOF = k_2 \gamma / (NA)^2 \quad (2)$$

Meanwhile, it is thought that $\gamma$ may be decreased or NA may be increased according to the equation (1) in order to form a fine exposure pattern by the reducing projection exposure apparatus. However, when $\gamma$ is decreased, it becomes very difficult to make a lens and when the NA is increased, the DOF is reduced. Thus, there is a limit in forming the fine resist pattern in the exposure apparatus in addition to the resist material and it is difficult to actually form a pattern of at least the same resolution as the wavelength.

As described above, recently, a method for forming a resist pattern using a phase shift mask has been proposed as a methods of forming a fine resist pattern not restricted by the resist material and the exposure apparatus.

FIGS. 7(a) and 7(b) are views showing the structure and a principle of a phase shift mask, in which FIG. 7(a) is a sectional schematic view showing the structure of a phase shift mask and FIG. 7(b) is a graph showing a light intensity distribution on a surface perpendicular to an optical axis of a lens in a case where coherent light is partially applied to the phase shift mask shown in FIG. 7(a) and the diffracted light is focused by the lens. Referring to these figures, reference numeral 10 designates a phase shift mask which comprises a quartz substrate 2 and a phase shifter 1. In addition, in FIG. 7(b), the part where the light intensity is nearly 0 corresponds to an edge of the shifter 1.

Next, a method for forming a resist pattern using the phase shift mask will be described hereinafter.

The phase shift mask 10 is used as a reticle. When light from a light source is applied to a wafer on which a resist is applied by the reducing projection exposure apparatus shown in FIG. 9, the light from the light source is diffracted by an edge of the phase shifter 1 which comprises a wide resist towards a lower part of the phase shifter 1. Thus, a region in which a light intensity is lowered is only formed just under the edge of the phase shifter 1. Then, the transmitted light having the light intensity distribution shown in FIG. 7(b) is applied to the wafer on which the resist is present. Then, the resist on the wafer is subjected to pattern exposure and normal developing processing. As a result, a fine resist pattern having a precision which is one-half of the wavelength of the light can be formed. In addition, when a negative type resist is used as the resist on the wafer, an opening pattern is formed Just under the edge of the phase shift mask. Alternatively, when a positive type resist is used, the resist just under the edge of the phase shift mask is left on the wafer and a resist pattern in the form of a line is formed on the wafer.

FIGS. 8(a) and 8(b) are sectional views showing steps in manufacturing the phase shift mask. In these figures, the same references as those in FIGS. 7(a) and 7(b) designate the same or corresponding parts and reference numeral 1a designates a resist responsive to a negative type electron beam (referred to as an EB hereinafter) such as chloromethyl styrene. More specifically, as shown in FIG. 8(a), the resist 1a for the negative type EB is applied to the quartz substrate 2 and an EB exposure and developing process are normally performed. Then, as shown in FIG. 8(b), the resist 1a at an exposed region is left on the substrate 2 and then the phase shift mask 10 shown in FIG. 7(a) can be produced.

According to the conventional method for forming a resist pattern, the phase shift mask is used as a reticle and a fine exposure pattern is projected onto a resist and then the resist is developed. As a result, a fine resist pattern of a precision equal to or less than the wavelength of exposing light can be formed.

However, in the conventional resist pattern forming method using the phase shift mask, while a fine resist pattern of the same precision as the wavelength of light or less can be formed, an edge angle $\theta_2$ of the phase shifter 1 varies in manufacturing the phase shift mask as shown in FIG. 8. Therefore, the light intensity distribution of the exposure pattern obtained through the phase shift mask 10 shown in FIG. 7(b) also varies, so that the contrast of the light intensity in the light intensity distribution can not be constant. Thus, in order to obtain a fine resist pattern having a predetermined width, the amount of development of the resist has to be controlled by changing the developing conditions, such as developing time each time in developing the resist after the exposure pattern is applied. However, since this process is very troublesome and can not be performed with high precision, the dimensions of the resist pattern still vary, so that it is very difficult to form the resist pattern having a predetermined width easily with high yield and reproducibility. Especially, when the contrast of the light intensity in the exposure pattern is reduced, the reactivity of the resist in the developing process is reduced. Therefore, if the amount of development of the resist is increased by increasing the developing time, the difference in the development of an upper layer and a lower layer of the resist is increased. For example, when an opening pattern is formed on the negative type resist, the opening becomes overhanging shape and the dimensional precision of the pattern is reduced. When such a resist pattern is used in the processing of the wafer thereafter, the processing dimensions vary and characteristics of the product can be adversely affected.

SUMMARY OF THE INVENTION

The present invention was made to solve the above problems and it is an object of the present invention to provide a method for forming a resist pattern for manufacturing a fine resist pattern having a width equal to or less than a wavelength of light easily, reproducibility, and precisely.

Herein, the fine resist pattern in the following description means a resist pattern having dimensions equal to or less than the wavelength of light used to form a pattern.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a method for forming a resist pattern, a phase shift mask in which an edge angle of a phase shifter is within one of the ranges of about 70° to 85° and about 95° to 110° is used as a reticle. Therefore, the light intensity distribution of an exposure pattern formed by a projection lens does not vary and the contrast of light intensity is constant. As a result, a fine resist pattern having a desired width can be provided precisely and reproducibility under the predetermined developing conditions.

In addition, according to a second aspect of the present invention, in a method for forming a resist pattern, there is provided a light shielding film which, due to its width, can not be resolved as the exposure pattern itself on a side wall at the edge of a phase shifter. Therefore, it is possible to control, by the width of this light shielding film, the width of a dark part of the exposure pattern formed by the projection lens, that is, the width of the region in which the light intensity is reduced to or below a constant threshold level in the light intensity distribution. As a result, the dimensional width of the resist pattern produced in the step of exposure can be controlled and then a fine resist pattern having a desired width can be formed precisely, and reproducibility under constant developing conditions.

BRIEF DESCRIPTION OF THE DRAWINGS

FIGS. 4(a)–4(d) are sectional views showing steps of forming a resist pattern on a wafer using the phase shift mask shown in FIG. 1, in which the edge angle of the phase shifter ranges from 70° to 85°;

FIGS. 7(a) and 7(b) are views showing the structure of a phase shift mask and the function thereof;

FIGS. 8(a) and 8(b) are views showing an example of the steps of manufacturing the phase shift mask.

DETAILED DESCRIPTION OF PREFERRED EMBODIMENTS

An embodiment of the present invention will be described with reference to the drawings hereinafter.

Figure 1:
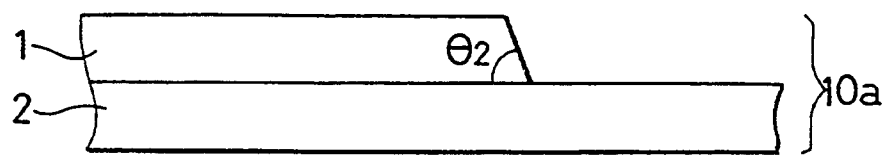
FIG. 1 is a sectional view schematically showing a phase shift mask used in a method for forming a resist pattern in accordance with an embodiment of the present invention.

FIG. 1 is a sectional view schematically showing a phase shift mask used in a method for forming a resist pattern in accordance with a first embodiment of the present invention. In FIG. 1, reference numeral 1 designates a phase shifter, reference numeral 2 designates a quartz substrate, reference numeral 10a designates a phase shift mask, and reference character $\theta_2$ designates an edge angle of the phase shifter 1. The edge angle $\theta_2$ ranges from 70° to 85°. The phase shift mask 10a is obtained by measuring the edge angle of the phase shifter of the phase shift masks and selecting one for which the angle $\theta_2$ ranges from 70° to 85°.

Figure 2:
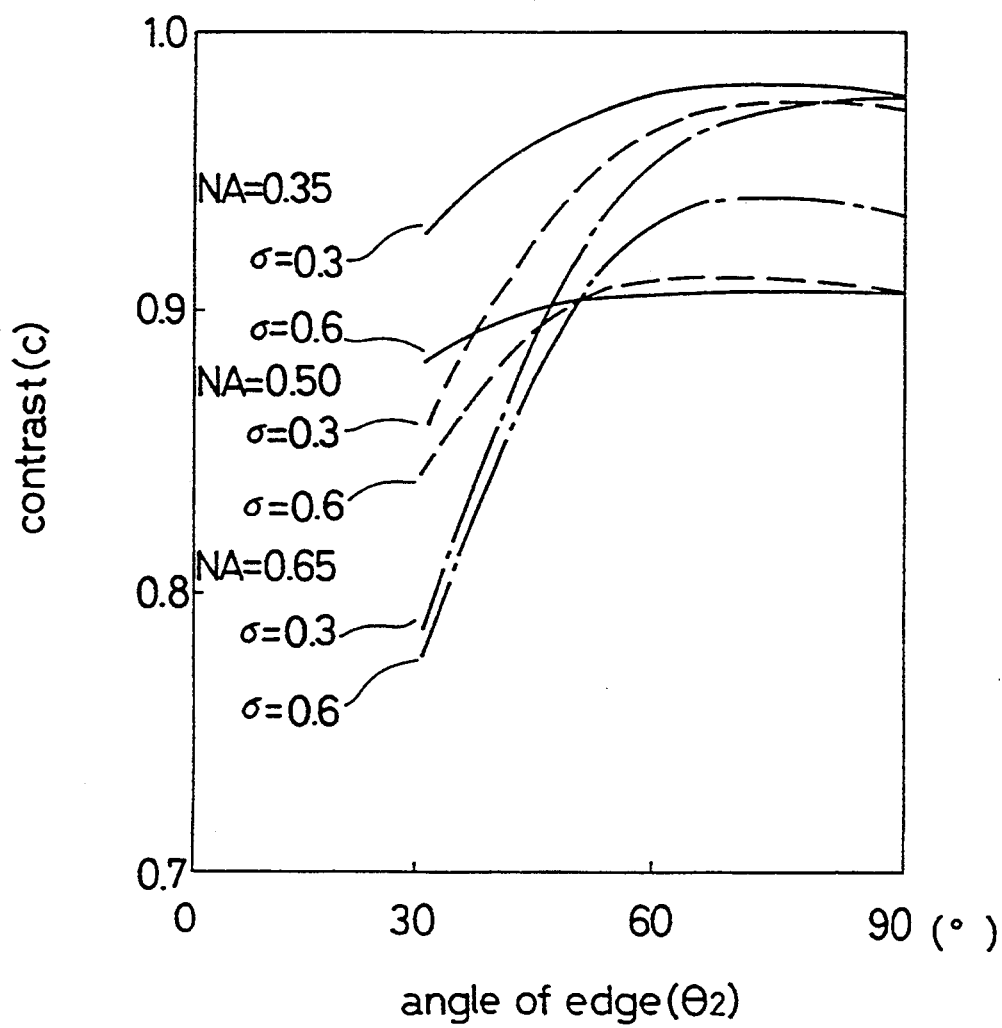
FIG. 2 is a graph showing the relation between contrast (C) of light intensity in an exposure pattern (light intensity distribution) produced by a reducing projection exposure apparatus (whose light source wavelength is 365 nm) using a phase shift mask as a reticle as a function of the edge angle ($\theta_2$) of a phase shifter of the phase shift mask.

FIG. 2 is a graph showing the relation between contrast (C) of light intensity in an exposure pattern (light intensity distribution) obtained in a reducing projection exposure apparatus (whose light source wavelength is 365 nm) using a phase shift mask as a reticle as a function of the edge angle $\theta_2$ of the phase shifter of the phase shift mask. In addition, in the figure, reference character NA designates numerical aperture and $\sigma$ designates coherency value. In addition, the contrast (C) of the light intensity is obtained from the following equation (3) where Imax and Imin are a maximum value and a minimum value of the light intensity distribution, respectively.

$$C = (I_{max} - I_{min})/(I_{max} + I_{min}) \quad (3)$$

As can be seen from FIG. 2, in this phase shift mask 10a, in which the edge angle ($\theta_2$) of the phase shifter 1 ranges from 70° to 90°, even when the numerical aperture (NA) and the coherency value ($\sigma$) of the exposure apparatus change, the light intensity distribution of the exposure pattern does not vary and then the contrast (C) of the light intensity is constant. In addition, although the optical wavelength is 365 nm in FIG. 2, the same effect can be obtained even if the optical wavelength is approximately 248 nm or 190 nm.

Initially, the allowable range for the angle $\theta_2$ of the edge of the phase shifter is 90°±20°. However, if that angle $\theta_2$ shifts slightly from 90°, some of the light passing through the mask is reflected from the oblique surface of the phase shifter. The reflected light is incident on the wafer, for example, wafer 15 of FIG. 9, distorting the light intensity profile. For instance, the light intensity profile of FIG. 7(b) may be shifted to the right relative to the position of the edge of the phase shifter indicated in FIG. 7(b) by the vertical line, producing an undesired image.

Figure 9:
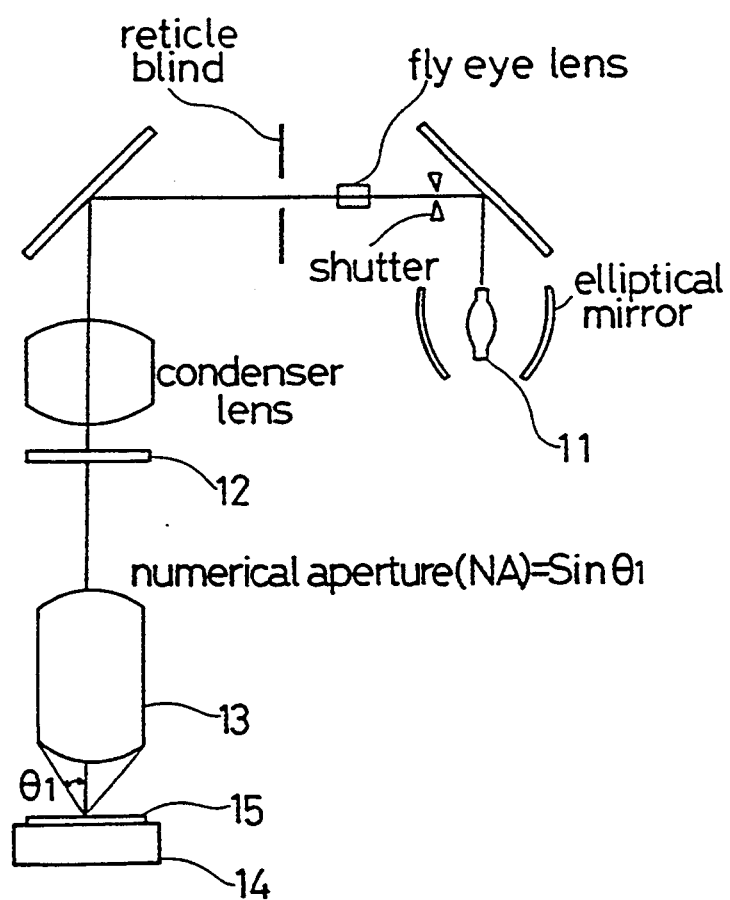
FIG. 9 is a view showing a structure of a reducing projection exposure apparatus.

In order to focus the light that is reflected from the oblique surface of the phase shifter of FIG. 1 on a wafer, like wafer 15, in a projection system, like that illustrated in FIG. 9, the following relationship should be satisfied $$2|90° - \theta_2| \leq \alpha.$$

As illustrated in FIG. 9, the numerical aperture, NA, of the projection system is related to the angle of the light incident on and exiting from the projection lens 13. In fact, such a projection system has respective numerical apertures on each side of the projection lens 13. In the foregoing equation, as shown in the equation appearing in FIG. 9, sin $\alpha$ is the numerical aperture $NA_1$ on the mask side of the projection lens 13 and the numerical aperture on the opposite side of the projection apparatus, i.e., toward the wafer 15, is $NA_2$. If the ratio at which the image is reduced from the mask size to the image on the wafer is m, then the coherency $\sigma$, according to a well known relationship, is $$\sigma = (1/m)(NA_1/NA_2).$$

In a typical reducing projection exposure apparatus, $NA_2$ equals 0.5, $\sigma$, as illustrated in FIG. 2 of the application, equals 0.6, and m equals 5. Solving the foregoing equations for $\alpha$, $\alpha$ equals approximately 8.6°, so that $\theta_2$ should be outside the range of 90°±4.3°. Accordingly, in a practical projection exposure system, the range of the phase shifter edge angle $\theta_2$ should be further limited from 90°±20° to lie between about 70° to about 85° or from about 95° to about 110° to produce the desired image of the mask on a Wafer without distortion of the light pattern.

FIGS. 4(a)-4(d) are sectional views showing steps of forming a resist pattern on a wafer using the phase shift mask 10a in which the edge angle of the phase shifter ranges from 70° to about 85°. In these figures, reference numeral 4 designates a GaAs substrate, reference numeral 5 designates a resist, reference numeral 5a designates a crosslinking region, and reference numeral 5b designates a non-crosslinking region. The resist 5 is a negative type resist in which an exposed part is once crosslinked and made negative by heating.

Next, the steps of forming the resist pattern will be described.

First, referring to FIG. 4(a), the GaAs substrate 4 onto which the resist 5 having a predetermined thickness is applied is irradiated with an exposure pattern by a reducing projection exposure apparatus in which the phase shift mask 10a having an edge angle of the phase shifter 1 (not shown) ranging from 70° to about 85° is used as the reticle. Then, referring to FIG. 4(b), the crosslinking region 5a and the non-crosslinking region 5b corresponding to an exposed region and a non-exposed region, respectively are formed on the resist 5 by heating. Then, referring to FIG. 4(c), flood exposure is performed and then the regions are developed using predetermined alkaline developer. Then, referring to FIG. 4(d), an opening having a predetermined width 1 is formed in the resist 5. In these steps, since the light intensity distribution of a bright part and a dark part of the exposure pattern in the exposing step shown in FIG. 4(a) has a constant contrast, when exposure and developing conditions are determined in accordance with material, film thickness or the like of the resist 5, it is possible to form a fine opening pattern, for example whose width 1 is 0.25 micron and an overhanged amount $W_1$ is 0.15 micron or less, with high precision. In addition, the same opening pattern can be formed in the same manner as described above by using another phase shift mask in which an edge angle of a phase shifter ranges from 70° to 85°.

Meanwhile, when an opening pattern is formed by the same manner as described above using a plurality of phase shift masks having edge angles of the phase shifters smaller than 60° and different from each other, one in which the width 1 of the opening of the resist pattern produced does not reach 0.25 micron or the resist opening does not reach the bottom and resist remains on the substrate 4. However, when the developing time for the respective resists is increased to continue the developing reaction in order to obtain the opening pattern having an opening width 1 of 0.25 micron, the overhang amount $W_1$ becomes 0.2 micron or more. As a result, there is provided a pattern in which the width of an upper part of the opening significantly differs from that of a lower part thereof. Thus, the dimensional precision of that pattern is reduced.

In the step of forming the resist pattern in accordance with this embodiment of the present invention, the phase shift mask in which an edge angle of the phase shifter ranges from 70° to 85° is used and the negative type resist 5 on the GaAs substrate 4 is irradiated with a predetermined exposure pattern using this mask as a reticle. Then, since the contrast of a light intensity of this exposure pattern (light intensity distribution) is kept at the maximum level for the exposure conditions, the opening pattern of the resist obtained by applying and developing the exposure pattern has a constant opening width suited to the developing conditions. As a result, the opening pattern comprising an opening having a predetermined width can be provided easily and reproducibility without adjusting the developing time or the like each time in the developing step after exposure, for example to continue the developing reaction so as to obtain a desired width.

Figure 5A:
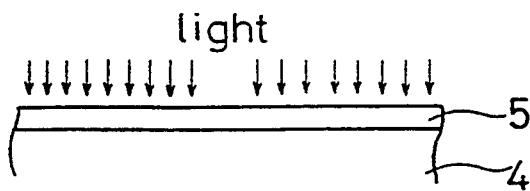
FIGS. 5(a)–5(e) are sectional views showing the steps of forming a recess type gate electrode of an FET using the resist pattern produced according to FIGS. 4(a)–4(d)
Figure 5B:
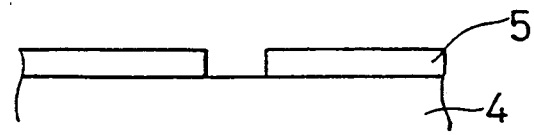
Figure 5C:
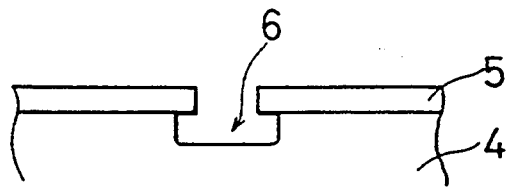
Figure 5D:
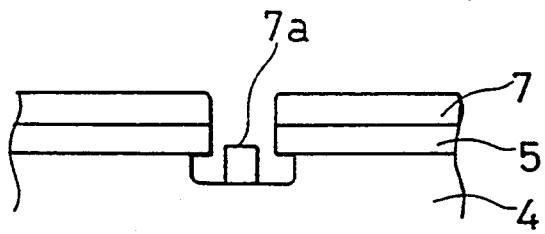
Figure 5E:
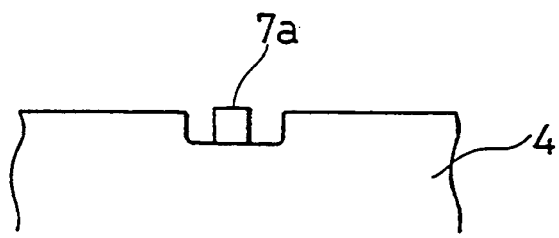

Since the dimensions of the opening pattern thus obtained are determined by the contrast of the light intensity in the light intensity distribution of the exposure pattern with constant developing conditions, the opening pattern is excellent in dimensional precision in which the dimensional difference between an upper part and a lower part of the opening pattern is small, that is, the above described overhang amount $W_1$ is small. For example, FIGS. 5(a)-5(e) show a case where the thus formed opening pattern is used in a step of forming a recess type gate electrode of a field effect transistor (FET). As shown in FIG. 5(c) and (d), by using an opening pattern having an opening width 1 of 0.25 micron and an overhang amount $W_1$ of 0.15 or less, a recess 6 having a narrow width can be formed without increasing the resistance of an active layer and a gate electrode 7a having a gate length which is less than 0.25 micron can be formed in the recess 6.

In addition, in a case where an opening pattern having an opening width of 0.25 micron, which is formed by using a phase shift mask in which an edge angle of a phase shifter is 70° or less and by controlling developing time in the developing step after exposure, is used in the step of forming the recess type gate electrode of the FET, since the overhang amount $W_1$ is 0.2 micron or more, the recess width naturally becomes large and then the resistance of the active layer is increased. As a result, the high frequency characteristic of the FET is considerably deteriorated.

Although phase shift mask in which the edge angle of the phase shifter ranges from 70° to 85° is used in the above embodiment of the present invention, even if a phase shift mask in which an edge angle of a phase shifter ranges from 95° to 110° is used, since the contrast of the light intensity of the exposure pattern (light intensity distribution) can be kept constant as in the above embodiment of the present invention, the same effect as that in the above embodiment of the present invention can be obtained.

Figure 3A:
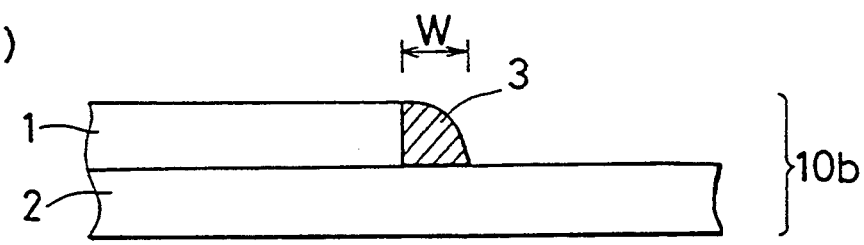
FIGS. 3(a) and 3(b) are views showing a structure of a phase shift mask used in a method for forming a resist pattern in accordance with a second embodiment of the present invention and an exposure pattern (light intensity distribution) obtained using the phase shift mask.
Figure 3B:
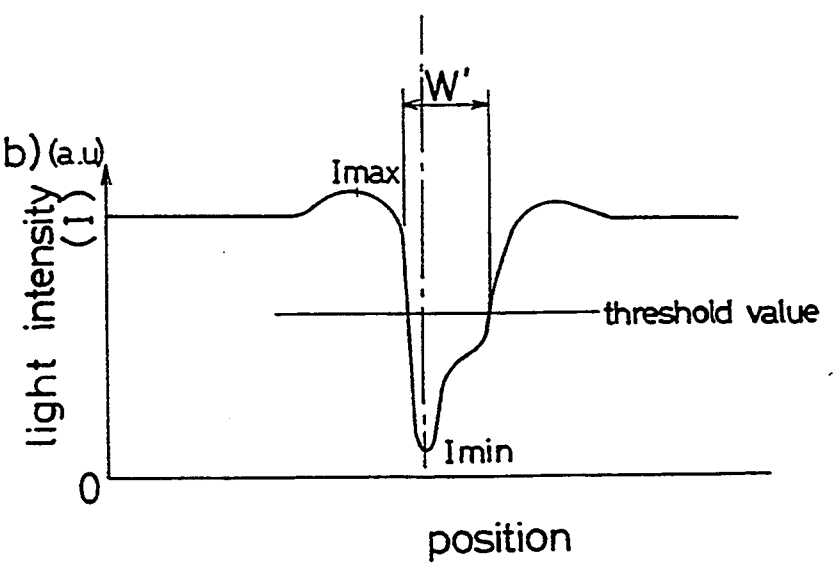

FIGS. 3(a) and 3(b) are views showing a structure of a phase shift mask used when a resist pattern in accordance with a second embodiment of the present invention is formed and an exposure pattern obtained by the above phase shift mask. FIG. 3(a) is a sectional view schematically showing the structure of the phase shift mask and FIG. 3(b) is a view showing a light intensity distribution on a surface perpendicular to the lens optical axis, which is obtained by partially applying coherent light to the phase shift mask shown in FIG. 3(a) and forming an image by focusing diffracted light through a lens. In these figures, the same references as in FIG. 1 designate the same or corresponding parts and reference numeral 3 designates a light shielding film formed of chrome, reference character W designates the width of the light shielding film, reference numeral 10b designates a phase shift mask, and reference character W' designates the width of a transfer pattern of intensity no more than a constant light intensity (threshold value) shown line in the figure. The light shielding film formed of chrome is not resolved as a pattern itself due to its width. In this figure, the width of the dark part of the exposure pattern (light intensity distribution) obtained by the phase shifter 1 can be determined as corresponding to the width W of the light shielding film 3 on a side wall of the phase shifter 1, and the width W corresponds to the pattern width W' transferred to the resist when the resist is developed under constant developing conditions.

Figure 6:
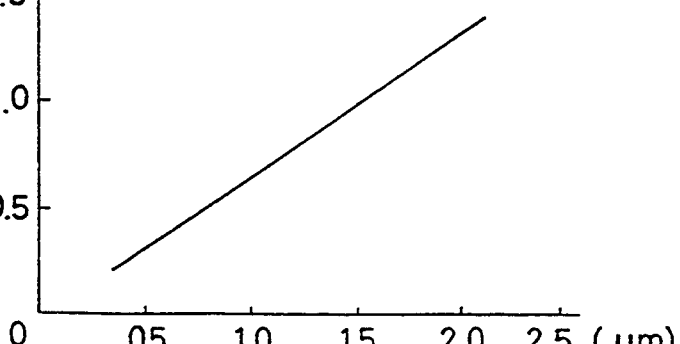
FIG. 6 is a graph showing the relation between the width W of a light shielding film and the film thickness of a chrome film at an initial stage when a light shielding film formed of chrome is manufactured as the phase shift mask shown in FIG. 3(a)

In addition, the phase shift mask is provided by forming the phase shifter 1 on the quartz substrate 2 in the same manner as the step shown in FIG. 8, forming a chrome film by depositing chrome on the whole surface by sputtering and then leaving the chrome film having a predetermined width on the side wall of the phase shifter 1 by a normal etch back method. FIG. 6 is a view showing the relation between the thickness of the chrome film at an initial stage and the width W of the light shielding film S obtained by etch back in the above steps. As can be seen from FIG. 6, the width W of the light shielding film 3 is determined by the thickness of the chrome film at the initial stage.

Then, the negative type resist is irradiated with the exposure pattern by the reducing projection exposure apparatus using the thus obtained phase shift mask 10b as a reticle in the same manner as in the first embodiment of the present invention. Then, light from the light source is diffracted by the light shielding film 3 on the side of the edge of the phase shifter 1 and a non-crosslinking region having a width W' between the crosslinking regions is formed on the resist corresponding to the width W of the light shielding film 3.

In addition, since light is diffracted by the light shielding film 3 in the phase shift mask 10b, a dark part in which the light intensity is reduced can be surely formed, so that a reduction in the contrast of the light intensity in the light intensity distribution of the exposure pattern is solved.

In the step of forming the resist pattern in this embodiment of the present invention, since there is provided on a side wall of the phase shifter 1 a light shielding film 3 formed of chrome and having a width which can not be resolved as a pattern itself, there can be formed a light intensity distribution of the exposure pattern having a region with a constant width in which the light intensity is reduced to a threshold level or less, corresponding to the width of the light shielding film 3. As a result, the width of the resist pattern produced by exposure processing can be controlled by the width of the light shielding film 3 and then a fine resist pattern having a predetermined width can be formed with high reproducibility under constant developing conditions without changing developing time to adjust the amount of development. In addition, since the contrast of the light intensity in the light intensity distribution of the exposure pattern is prevented from being reduced, the resist pattern is provided with high precision.

Although chrome is used as the light shielding film 3 in the above embodiment of the present invention, the same effect can be expected by using another metal film, if it can shield light.

As described above, according to the present invention, since a phase shift mask in which the edge angle of the phase shifter lies with a range from about 70° to 85° or a range of about 95° to 110° is used as a reticle in the step of forming the resist pattern, the exposure pattern applied to the resist has a light intensity distribution with a light intensity contrast kept at constant level. Therefore, a fine resist pattern having a predetermined width of the wavelength of the light or less can be provided with high dimensional precision and high reproducibility under the constant developing conditions. As a result, a semiconductor device with high performance in which fine processing is performed can be manufactured with a high yield.

In addition, according to the present invention, since there is provided a light shielding film having a width which can not be resolved as an exposure pattern itself on the side wall of the phase shifter of the phase shift mask, a region in which the light intensity is reduced below a constant threshold level can be formed corresponding to the width of the light shielding film in the exposure pattern formed by a projection lens. Therefore, a fine resist pattern having a predetermined width at the wavelength of light or less can be formed with high dimensional precision and high reproducibility under constant developing conditions. As a result, a semiconductor device of high performance in which fine processing is performed can be manufactured with a high yield.

What is claimed is:

1. A method for forming a resist pattern comprising:
   irradiating a phase shift mask, including a phase shifter disposed on a transparent substrate, the phase shifter having an edge forming an angle with the substrate in a range from about 70° to 85° and 95° to 110°, with light having a wavelength, the light being diffracted by the edge of the phase shifter;
   forming an image by focusing the diffracted light with a lens, thereby producing an exposure pattern having a region corresponding to the edge in which light intensity is reduced;
   applying the exposure pattern to a resist film on a wafer; and
   developing the resist film to form a resist pattern corresponding to the light intensity distribution of the exposure pattern.

2. The method for forming a resist pattern according to claim 1 including forming a pattern having dimensions no larger than the wavelength of the light.

3. The method for forming a resist pattern according to claim 1 wherein focus depth is at least 1.5 microns.

4. The method for forming a resist pattern according to claim 1 wherein the resist is a negative resist.

5. A method for forming a resist pattern comprising:
   irradiating a phase shift mask, including a phase shifter disposed on a transparent substrate, the phase shifter including a side wall and a light shielding film disposed at the side wall on the substrate and having a width, with light having a wavelength, the light being diffracted by the edge of the phase shifter;
   forming an image by focusing the diffracted light with a lens, thereby producing an exposure pattern having a region corresponding to the edge in which light intensity is reduced;
   applying the exposure pattern to a resist film on a wafer; and
   developing the resist film to form a resist pattern corresponding to the light intensity distribution of the exposure pattern wherein the light shielding film, due to its width, is not resolved as a pattern on the resist film;

6. The method for forming a resist pattern according to claim 5 including forming a pattern having dimensions no larger than the wavelength of light.

7. The method for forming a resist pattern according to claim 5 wherein focus depth is at least 1.5 microns.

8. The method for forming a resist pattern according to claim 5 wherein the resist is a negative resist.

* * * * *